United States Patent [19]

Akagi

[11] Patent Number: 4,839,612
[45] Date of Patent: Jun. 13, 1989

[54] HIGH-FREQUENCY POWER AMPLIFIER HAVING HETEROJUNCTION BIPOLAR TRANSISTOR

[75] Inventor: Junko Akagi, Kawasaki, Japan

[73] Assignee: Kabushiki Kaisha Toshiba, Kawasaki, Japan

[21] Appl. No.: 167,108

[22] Filed: Mar. 11, 1988

[30] Foreign Application Priority Data

Mar. 13, 1987 [JP] Japan ................... 62-56855

[51] Int. Cl.$^4$ ............................... H03F 3/191
[52] U.S. Cl. ................................. 330/302; 330/296
[58] Field of Search ............ 330/250, 296, 302, 303, 330/304, 305, 306; 357/16

[56] References Cited

U.S. PATENT DOCUMENTS

| | | | |
|---|---|---|---|
| 3,001,146 | 9/1961 | Knol et al. | 330/302 |
| 3,413,533 | 11/1988 | Kroemer et al. | 357/16 |
| 4,739,379 | 4/1988 | Akagi et al. | 357/16 |

OTHER PUBLICATIONS

IEEE MTT-S Digest 1987; "AlGaAs/GaAs Heterojunction Bipolar Transistors with 4W/mm Power Density at X-Band"; B. Bayraktaroglu et al; pp. 969-972.

Primary Examiner—Steven Mottola
Attorney, Agent, or Firm—Oblon, Fisher, Spivak, McClelland & Maier

[57] ABSTRACT

A class C power amplifier has a heterojunction bipolar transistor as an element for amplifying an input signal. A d.c. bias voltage source, such as a d.c. battery, is connected to the transistor, such that a d.c. bias voltage lower than the turn-on voltage of the transistor is applied between the base and emitter of the bipolar transistor. An inductance coil is connected in series between the emitter of the transistor and the d.c. bias voltage source. Since the d.c. bias voltage is applied to the heterojunction bipolar transistor, the external drive voltage for activating the transistor is reduced to increase the high-frequency power gain of the amplifier.

5 Claims, 5 Drawing Sheets

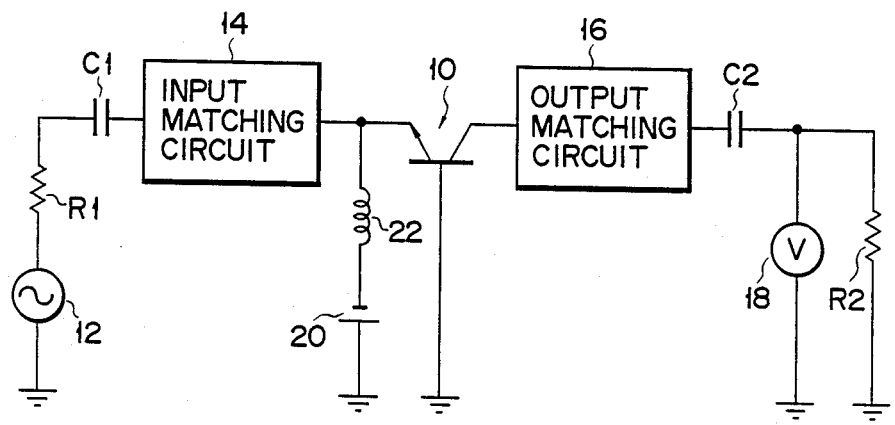
F I G. 2

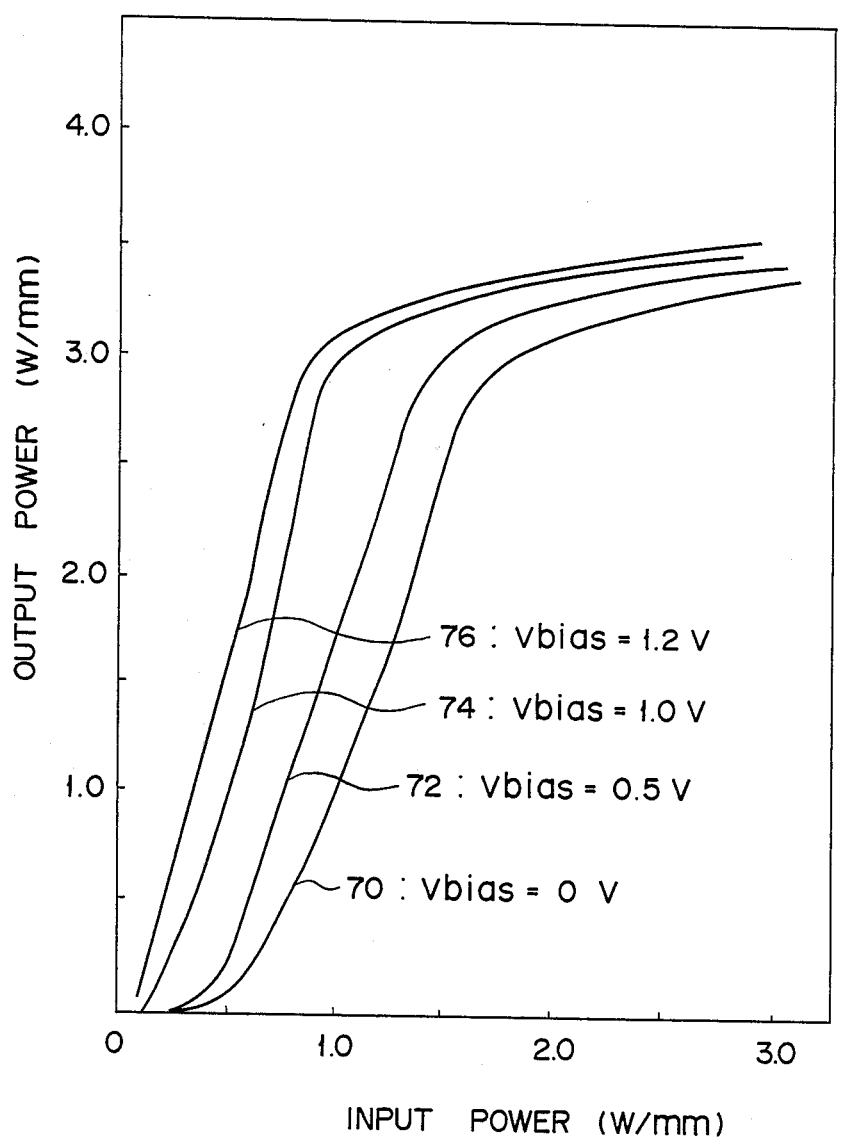
F I G. 5

HIGH-FREQUENCY POWER AMPLIFIER HAVING HETEROJUNCTION BIPOLAR TRANSISTOR

BACKGROUND OF THE INVENTION

1. Field of the Invention

The present invention relates to an amplifier and, more particularly, to a high-frequency power amplifier having a heterojunction bipolar transistor.

2. Description of the Related Art

A heterojunction bipolar transistor (hereinafter referred to as "HBT"), which is characterized in that its emitter and base are mutually connected, thus forming a heterojunction, is superior to a homojunction bipolar transistor in switching speed, high-frequency characteristic, and the like. This is because: (1) since the emitter and the base form a heterojunction, the emitter injection efficiency is high; (2) the impurity concentration of the base can be increased, thus reducing the base resistance; and (3) the impurity concentration of the emitter can be reduced, thereby decreasing the emitter junction capacitance. Hence, if an HBT is incorporated into a power amplifier, the amplifier can provide efficient power amplification in a high-frequency region.

Most HBTs have a heterojunction structure made of a GaAlAs/GaAs semiconductor material. Such an HBT has a relatively high turn-on voltage, however, such an HBT has not provided for great power gain in a power amplifier. This problem renders it difficult to realize a high-efficiency power amplifier circuit which includes an HBT.

SUMMARY OF THE INVENTION

It is therefore an object of the present invention to provide a new and improved high-frequency power amplifier.

It is another object of the invention to provide a new and improved high-frequency power amplifier which efficiently functions in a high-frequency region and provides a great power gain.

In accordance with the above objects, the present invention is addressed to a specific power amplifier circuit which has a heterojunction bipolar transistor used as an element for amplifying an input signal. A d.c. voltage-applying device is connected between the base and emitter of the heterojunction bipolar transistor, and applies a specific level of d.c. bias voltage to the transistor. The bias voltage is at a potential level lower than the turn-off drive voltage required for turning the transistor off. The d.c. bias voltage is additionally applied between the base and emitter of the heterojunction bipolar transistor at least the moment the transistor is activated. Therefore, the turn-on drive voltage, which is externally applied, can be reduced, whereby the power amplifier circuit has a great high-frequency power gain.

The present invention, and its objects and advantages will become more apparent from the following detailed description of a preferred embodiment.

BRIEF DESCRIPTION OF THE DRAWINGS

In the detailed description of the preferred embodiment of the invention, reference will be made to the accompanying drawings, in which:

FIG. 2 is a diagram schematically showing the main components of the power amplifier according to a preferred embodiment of the present invention;

FIG. 5 is a graph showing various input-output characteristics which the power amplifier according to the invention exhibits when d.c. bias voltages of 0V, 0.5V, 1.0V, and 1.2V are applied between the base and emitter of the HBT incorporated in the power amplifier.

DETAILED DESCRIPTION OF THE PREFERRED EMBODIMENT

Figure 1:
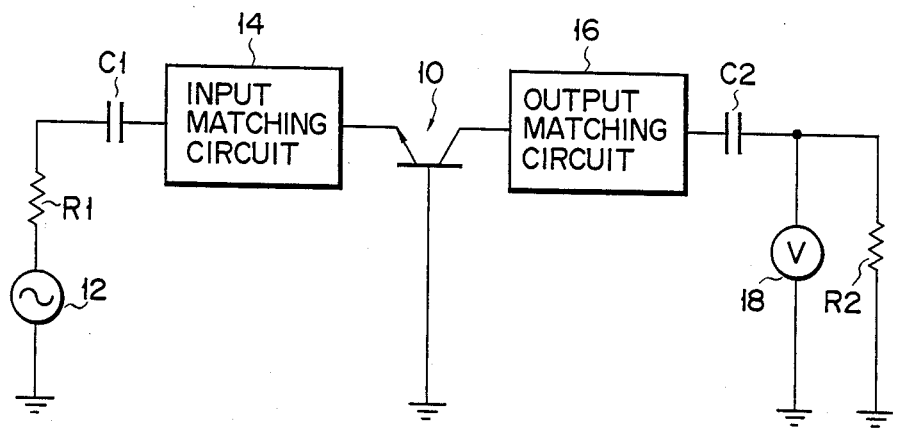
FIG. 1 is a diagram schematically showing the main components of a conventional power amplifier.

For facilitating the understanding of the present invention, a class C power amplifier using HBT 10, which is a basic type, will be first described, with reference to FIG. 1.

As is shown in FIG. 1, HBT 10 has an emitter electrode which is connected to a.c. input power supply 12. Resistor R1 (resistance: 50 ohms, for example), capacitor C1, and input matching circuit 14 are connected in series between the emitter of HBT 10 and a.c. input power supply 12. Capacitor C1 is used to filter out the d.c. component of a signal supplied from power supply 12. The base electrode of HBT 10 is grounded The collector electrode of HBT 10 is coupled to output matching circuit 16 which in turn is connected by capacitor C2 to a series circuit composed of power supply 18 and resistor R2.

If HBT 10 is made of a GaAlAs/GaAs semiconductor material, since its turn-on voltage is relatively high, a relatively high power-supply voltage must be used to drive HBT 10 to turn it on. Undesirably, the power amplifier requires a great input power. This fact leads to the problem of how the power amplifier can provide a sufficiently great power gain.

This technical problem can be effectively solved by a power amplifier according to the present invention, which will be described as follows.

FIG. 2 shows a class C power amplifier according to the invention, which includes a GaAlAs/GaAs HBT 10 the base region of which has a band gap narrower than that of the emitter region. As is shown in FIG. 2, a series circuit comprised of d.c. bias voltage source 20 and inductive element 22 is connected between the base electrode and emitter electrode of HBT 10. Inductive element 22 functions to remove, or cut off the a.c. component of the signal generated on a signal path between d.c. bias power supply 20 and the emitter of HBT 10. Bias voltage source 20 may be a known d.c. battery, whereas inductive element 22 may be an induction coil. More specifically, the base of HBT 10 is grounded, and d.c. bias voltage source 20 has its one electrode grounded. Inductive element or coil 22 is connected between the other electrode of d.c. bias source 20 and the emitter of HBT 10. Bias voltage source 20 constantly applies a d.c. voltage, as a bias voltage, between the base and emitter of HBT 10. This bias voltage is at a level selected so as to be lower than the specific level, known as a "turn-on voltage", so as to maintain HBT 10 at a nonconductive voltage level.

Since d.c. bias voltage source 20 is coupled between the base and emitter of HBT 10, its output voltage is applied to HBT 10, as a part of the turn-on voltage, in addition to the turn-on voltage applied to HBT 10 from input power supply 12, whereby the voltage to be supplied by input power supply 12 to turn on HBT 10 is lower than it would be otherwise. In other words, since bias voltage source 20 applies a d.c. bias voltage as an additional turn-on voltage between the base and emitter of HBT 10 at least when HBT 10 is rendered conductive, the externally applied turn-on voltage is apparently reduced by this additional turn-on voltage. This decrease of the turn-on voltage contributes to the reduction of the input power consumption of the power amplifier. As a result, the power amplifier can have a great power gain, while fully utilizing the inherent advantages of HBT 10, i.e., the high-speed switching characteristic and the excellent high-frequency characteristic.

Figure 3:
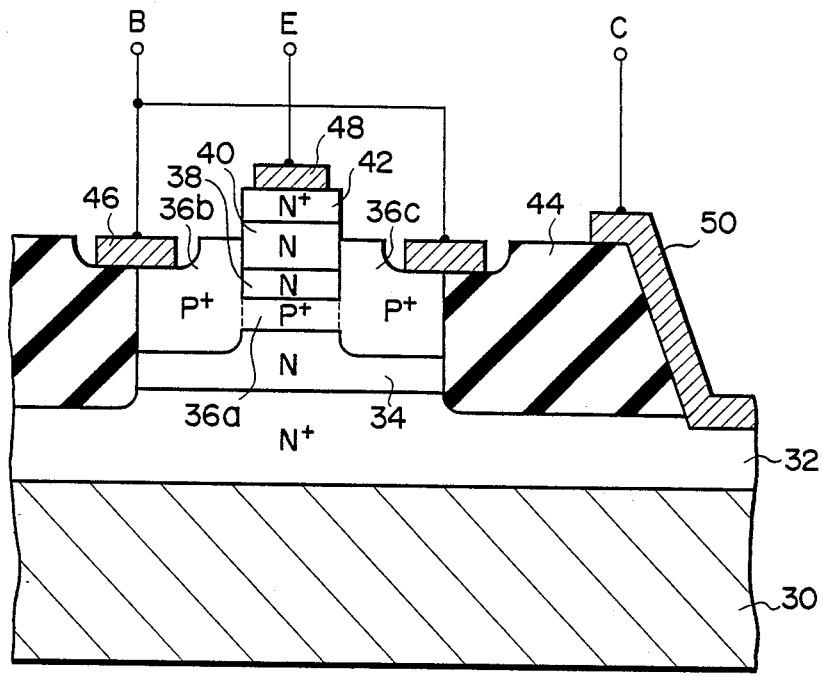
FIG. 3 is a cross-sectional view showing a part of the HBT incorporated in the power amplifier according to the invention.

FIG. 3 is a cross-sectional view schematically showing HBT 10 preferably used in the power amplifier of FIG. 2. As is shown in this figure, HBT 10 has semi-insulative substrate 30 made of GaAs. GaAs layer 32 heavily doped with an N type impurity (hereinafter called "N+ GaAs layer" in accordance with the conventional naming in the art) is formed on one major surface of substrate 30. N type GaAs layer 34 is formed on N+ GaAs layer 32. Layers 32 and 34 constitute the collector of HBT 10. N+ GaAs layer 32 has an impurity concentration of $5 \times 10^{18}$ cm$^{-3}$ and a thickness of about 500 nm. N+ GaAs layer 34 has an impurity concentration of $2 \times 10^{16}$ cm$^{-3}$ and a thickness of about 1.05 μm. P+ type GaAs layers 36a, 36b and 36c are located specifically as is illustrated in FIG. 3, and function as the base of HBT 10. P+ type GaAs layer 36a is equivalent to the internal base region of HBT 10, whereas P+ type GaAs layers 36b and 36c are equivalent to the external base region of HBT 10. P+ type GaAs layer 36a has an impurity concentration of $1 \times 10^{19}$ cm$^{-3}$ and a thickness of about 190 nm.

N type Ga$_{1-x}$Al$_x$As (where x<0.3) layer 38 is formed on P+ type GaAs layer 36a. N type GaAlAs layer 40 is formed on N type Ga$_{1-x}$Al$_x$As layer 38. N+ type GaAs layer 42 is formed on N type GaAlAs layer 40. Layer 38 has an impurity concentration of $3 \times 10^{17}$ cm$^{-3}$ and a thickness of 30 nm. Layer 40 has an impurity concentration of $3 \times 10^{17}$ cm$^{-3}$ and a thickness of 160 nm. Layer 42 has an impurity concentration of $5 \times 10^{18}$ cm$^{-3}$ and a thickness of 130 nm. Layers 34, 36, 38, 40, and 42 are surrounded by insulative layer 44 which functions as an isolation layer. Conductive layer 46 contacts P+ type base layers 36b and 36c, and therefore functions as the base electrode of HBT 10. Conductive layer 48 is formed on P+ layer 42 and functions as the emitter electrode of HBT 10. Conductive layer 50 is formed on a slanted side surface of insulative layer 44. Layer 50 contacts N+ layer 32, and therefore functions as the collector electrode of HBT 10.

Figure 4:
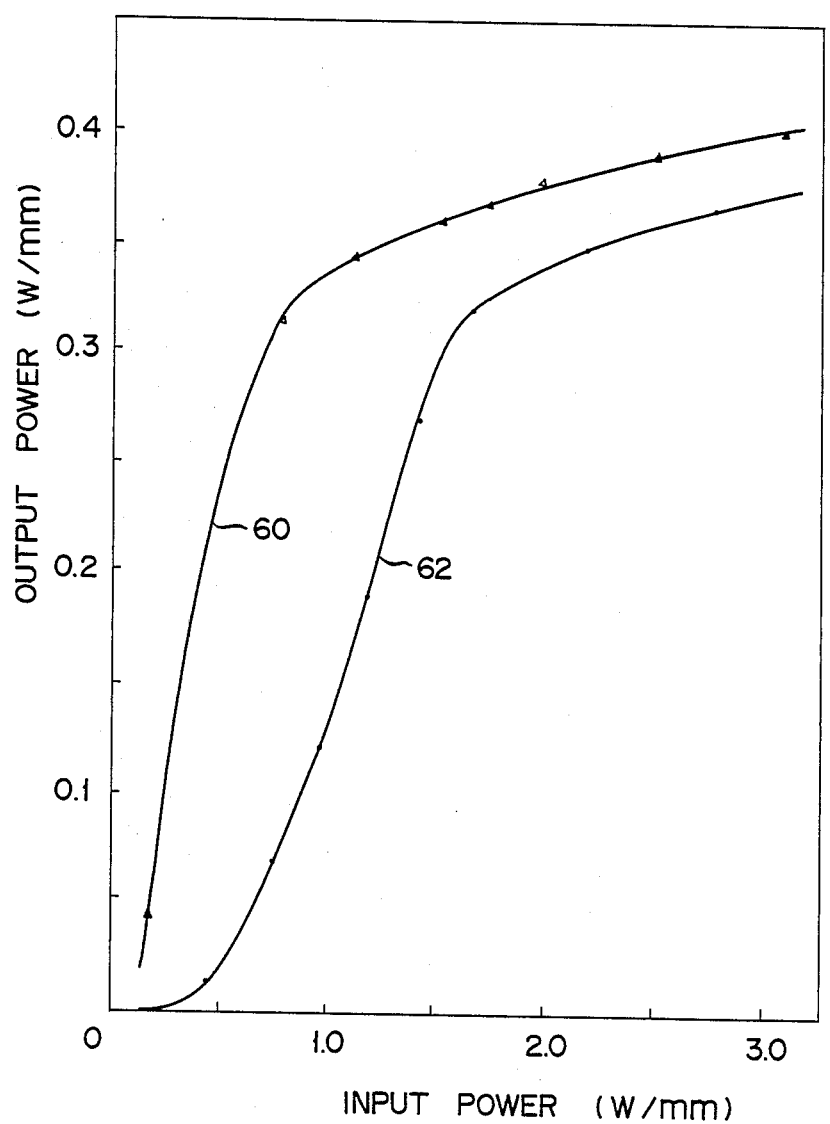
FIG. 4 is a graph representing the input-output characteristic of the power amplifier according to the invention, and also that of the conventional power amplifier shown in FIG. 1.

The inventor hereof made power amplifiers having HBT 10 shown in FIG. 3, and measured the input-output characteristics of these power amplifiers. The results were as is shown in FIG. 4, wherein curve 60 represents the relationship between the input and output powers of the power amplifier according to the invention, which has no d.c. bias voltage source 20 shown in FIG. 2, and curve 62 represents the relationship between the input and output powers of the conventional power amplifier shown in FIG. 1, which has no d.c. bias voltage source. As is evident from FIG. 4, the output power of the conventional power amplifier slowly increased as the input power was increased. The ratio of the output power to the input power, i.e., the power gain, was relatively small. In contrast, the output power of the power amplifier according to the invention quickly increases as the input power is increased. For instance, as curve 60 indicates, when the input power was increased from 0 W/mm to 1.0 W/mm, the output power increased rapidly to more than 0.3 W/mm. Obviously, the power amplifier according to the invention had a great power gain.

FIG. 5 is a graph showing various input-output characteristics which the power amplifier according to the invention exhibited when d.c. bias voltages of 0V (curve 70), 0.5V (curve 72), 1.0V (curve 74), and 1.2V (curve 76) were applied between the base and emitter of the HBT incorporated in the power amplifier. The input-output characteristic represented by curve 70 wherein d.c. bias voltage Vbias is 0V corresponds to the conventional power amplifier. As can be understood from curves 72, 74, and 76, when the d.c. bias voltage Vbias was 0.5V to 1.2V, preferably 1.0V to 1.2V, the power gain was maximized. (Since the standard value of the turn-on voltage of the HBT is 1.4V to 1.5V, Vbias of 0.5V to 1.2 V was 33% to 80% of the turn-on voltage, and Vbias of 1.0V to 1.2V was 67% to 80% of the turn-on voltage.)

Figure 6:
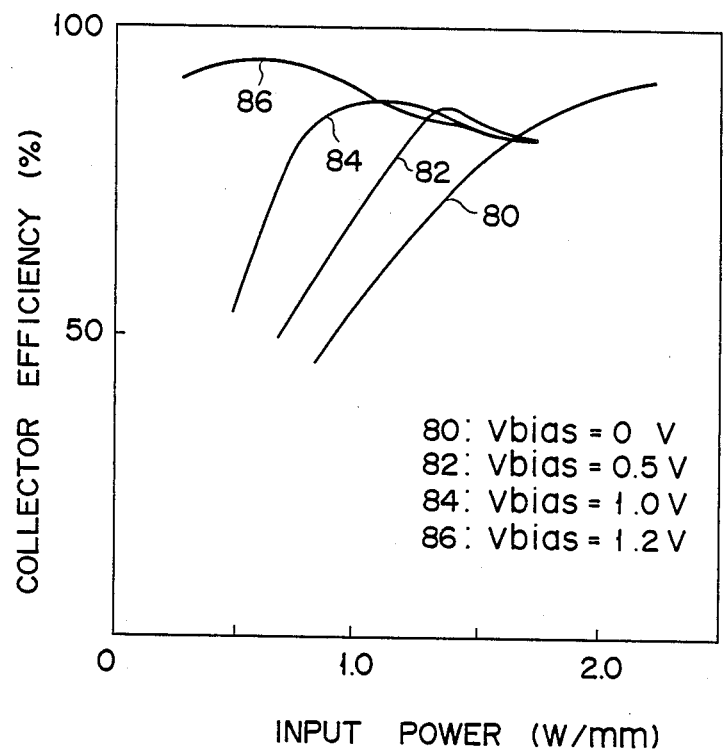
FIG. 6 is a graph showing various relationships between the input power of the power amplifier according to the invention and the collector efficiency which the HBT incorporated in the amplifier exhibits when d.c. bias voltages of 0V, 0.5V, 1.0V, and 1.2V are applied between the base and emitter of the HBT.

Unless the d.c. bias voltage applied constantly to HBT 10 exceeds 1.2V, the d.c. current flowing in HBT 10 remains negligibly small, and so does the power consumed by HBT 10. The application of the d.c. bias voltage of 1.2V or less to HBT 10 cannot be said to affect adversely the operation of the power amplifier. This can be proved by the fact that even when d.c. bias voltage Vbias of 1.2V was constantly applied between the base and emitter of HBT 10, the collector efficiency of HBT 10 remained sufficiently high. FIG. 6 is a graph showing various relationships between the input power and the collector efficiency which HBT 10 exhibited when d.c. bias voltages of 0V, 0.5V, 1.0V, and 1.2V were applied between the base and emitter of HBT 10 used in the power amplifier according to the invention.

Although the invention has been described with reference to a specific embodiment, it shall be understood by those skilled in the art that numerous modifications may be made that are within the spirit and scope of the inventive contribution.

For example, GaAs/GaAlAs HBT 10 incorporated in the embodiment described above can be replaced by another heterojunction bipolar transistor such as InP-/InGaAs HBT.

What is claimed is:
1. A power amplifier circuit comprising:
   a III-V compound semiconductor heterojunction bipolar transistor having a base, an emitter and a collector; and
   voltage applying means connected between the base and the emitter of said transistor for applying a d.c. bias voltage to said transistor, and for reducing an externally supplied turn-on drive voltage required for rendering said transistor conductive;
   said d.c. bias voltage having a voltage level which is less than 80% of a specific voltage level needed to turn on said transistor, said d.c. bias voltage rang- ing between 0.5 volts and 1.2 volts, said voltage applying means comprising a d.c. power source and an inductive element connected in series, said inductive element connected between the emitter of said transistor and said d.c. power source.

2. The circuit according to claim 1, wherein said III-V compound semiconductor heterojunction bipolar transistor includes a GaAs heterojunction bipolar transistor.

3. The circuit according to claim 2, wherein said d.c. bias voltage ranges between 1.0 volt and 1.2 volts.

4. The circuit according to claim 3, wherein said inductive element includes an inductance coil.

5. The circuit according to claim 4, wherein said voltage applying means constantly applies the d.c. bias voltage to said transistor.

* * * * *